United States Patent
Cho (10) Patent No.: US 12,024,148 B2
(45) Date of Patent: Jul. 2, 2024

(54) APPARATUS FOR SENSING SPEED OF WHEEL, CONTROL SYSTEM USING THE SAME, AND OPERATION METHOD THEREOF

(71) Applicants: HYUNDAI MOTOR COMPANY, Seoul (KR); KIA CORPORATION, Seoul (KR)

(72) Inventor: Jae Seol Cho, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 158 days.

(21) Appl. No.: 17/516,125

(22) Filed: Nov. 1, 2021

(65) Prior Publication Data

US 2023/0067056 A1 Mar. 2, 2023

(30) Foreign Application Priority Data

Aug. 25, 2021 (KR) .................. 10-2021-0112500

(51) Int. Cl.
| | | |
|---|---|---|
| *B60T 8/32* | (2006.01) | |
| *B60B 27/00* | (2006.01) | |
| *G01P 3/44* | (2006.01) | |
| *G01P 3/488* | (2006.01) | |
| *G01R 33/07* | (2006.01) | |

(52) U.S. Cl.
CPC .......... *B60T 8/329* (2013.01); *B60B 27/0068* (2013.01); *G01P 3/443* (2013.01); *G01P 3/488* (2013.01); *G01R 33/07* (2013.01)

(58) Field of Classification Search
CPC ...... B60T 8/329; B60B 27/0068; G01P 3/443; G01P 3/488; G01R 33/07
See application file for complete search history.

(56) References Cited

U.S. PATENT DOCUMENTS

| | | | | |
|---|---|---|---|---|
| 6,133,728 A | * | 10/2000 | Manlove | G01P 3/488 324/173 |
| 9,921,081 B2 | * | 3/2018 | Lerchenmueller | G01M 13/00 |
| 2002/0097040 A1 | * | 7/2002 | Takizawa | F16C 19/525 324/207.25 |
| 2003/0001563 A1 | * | 1/2003 | Turner | G01D 5/147 324/165 |
| 2018/0328955 A1 | * | 11/2018 | Kordik | G01P 3/488 |

FOREIGN PATENT DOCUMENTS

KR 10-2020-0124116 A 11/2020

* cited by examiner

*Primary Examiner* — Reena Aurora
(74) *Attorney, Agent, or Firm* — MORGAN, LEWIS & BOCKIUS LLP (57) ABSTRACT

An apparatus of sensing a speed of a wheel, capable of improving operational stability and/or reliability of a sensor, a control system using the same, and an operating method thereof, wherein the apparatus is an apparatus of sensing a rotation speed of a wheel of a vehicle, provided to be spaced from an external circumferential surface of a tonewheel mounted on the wheel, includes a housing; a magnet disposed in the housing; a magnetic sensor located adjacent to the magnet in the housing; and a coil wound around the magnet.

16 Claims, 7 Drawing Sheets

APPARATUS FOR SENSING SPEED OF WHEEL, CONTROL SYSTEM USING THE SAME, AND OPERATION METHOD THEREOF

CROSS-REFERENCE TO RELATED APPLICATION(S)

The present application claims priority to Korean Patent Application No. 10-2021-0112500 filed on Aug. 25, 2021 the entire contents of which is incorporated herein for all purposes by this reference.

BACKGROUND OF THE INVENTION

Field of the Invention

The present invention relates to an apparatus of sensing a speed of a wheel, capable of improving operational stability and/or reliability of a sensor, a control system using the same, and an operating method thereof.

Description of Related Art

A vehicle may be provided with various control systems to improve drivability and stability, and various sensors may be provided and used in the vehicle to provide information on the operating state of the vehicle to each of the control systems.

As an example of the sensors provided in the vehicle, there may be a wheel speed sensor (WSS) provided on a wheel of the vehicle to detect a rotation speed of the wheel. Information on the rotation speed of the wheel detected by the wheel speed sensor may be transmitted to an electronic control unit (ECU) or the like of the vehicle, and may be used to operate control systems such as an anti-lock brake system (ABS), an anti-spin regular (ASR), a vehicle dynamic control (VDC), or the like.

In general, since a wheel may be configured to detect a rotation speed of the wheel using a single wheel speed sensor, when an abnormality or failure occurs in a sensing unit, a terminal unit, or the like of the sensor, accurate information on the rotation speed of the wheel cannot be provided. Accordingly, since control systems of a vehicle, such as ABS or the like, may not be controlled stably, a stance of the vehicle may become unstable, or steering ability of the vehicle may be lost, while driving or braking of the vehicle.

Moreover, in autonomous driving in which most of the vehicle's driving is performed by the control systems, since functions of the vehicle should be maintained even when components thereof fail (in a disabled state) while driving, the concept of redundancy has been introduced. However, there may be a problem in that all components should be provided in plural, i.e., an amount of two or more.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing an apparatus of sensing a speed of a wheel, configured for improving operational stability and/or reliability of a sensor, a control system using the same, and an operating method thereof.

According to various aspects of the present invention, an apparatus of sensing a rotation speed of a wheel of a vehicle, configured to be spaced from an external circumferential surface of a tonewheel mounted on the wheel, includes a housing; a magnet disposed in the housing; a magnetic sensor located adjacent to the magnet in the housing; and a coil wound around the magnet.

The magnetic sensor may include a first terminal connected to a power line; a second terminal connected to a ground line; a printed circuit board connected to the first terminal and the second terminal, and on which an IC chip is mounted; and a sensing unit having a semiconductor sensor device electrically connected to the printed circuit board, wherein a first output line may be connected to the second terminal.

The sensing unit may be located in the housing between the tonewheel and the magnet, and the magnet may be located between the printed circuit board and the sensing unit.

The magnet may be formed to have a shape of a pillar, and a second output line may be connected to the coil.

The apparatus may further include a protective member provided in the housing to surround the magnetic sensor so as to protect the magnetic sensor from heat.

The magnetic sensor may form an active sensor configured for detecting a change in a magnetic field and outputting the detected change as a digital signal, and the coil wound around the magnet may form a passive sensor configured for detecting a change in a magnetic field and outputting the detected change as an analog signal of an AC voltage.

The magnet may include a first magnet unit formed to have a shape of a pillar, and a second magnet unit formed to have a shape of a cylinder with a hollow portion and in which a cutout portion is formed in at least one side wall thereof, wherein the first magnet unit and the second magnet unit may be integrally formed, the coil may be wound from the first magnet unit to the second magnet unit, and a second output line may be connected to the coil.

The apparatus may further include a protective member provided in the housing to surround the magnetic sensor so as to protect the magnetic sensor from heat, wherein the protective member may be disposed in the hollow portion of the second magnet unit.

The apparatus may further include an auxiliary magnet having a shape of a tube and a hollow portion, wherein the magnet and the auxiliary magnet may be spaced from each other, and the magnet may be located in the hollow portion of the auxiliary magnet, the coil may be wound around the auxiliary magnet, and a second output line may be connected to the coil.

The apparatus may further include a protective member provided in the housing to surround the magnetic sensor so as to protect the magnetic sensor from heat, wherein the protective member may be disposed in the hollow portion of the auxiliary magnet.

According to various aspects of the present invention, a control system includes a plurality of above-described apparatuses provided on or adjacent to each wheel of a vehicle to detect a rotation speed of each wheel; a main controller connected to the plurality of apparatuses and connected to a main power source; and a redundancy controller connected to the plurality of apparatuses and connected to the main power source and an auxiliary power source, wherein the main controller or the redundancy controller is provided with a detection signal received from the magnetic sensor in each apparatus and a detection signal received from the coil wound around the magnet in each apparatus, and when the magnetic sensor fails, the main controller or the redundancy controller is configured to control the vehicle by the detection signal received from the coil.

When the main controller fails, the redundancy controller may perform the control on behalf of the main controller.

When the main power source is inoperable, the control may be performed by supplying power to the redundancy controller by the auxiliary power source.

The control system may further include a communication link exchanging information between the main controller and the redundancy controller.

According to various aspects of the present invention, a method of operating the above-described control system includes supplying power to each of the plurality of apparatuses by the main controller or the redundancy controller, and determining whether the magnetic sensor in each of the plurality of apparatuses is normal; when the magnetic sensor is determined to be normal, receiving information regarding the rotation speed of the wheel from the magnetic sensor by the main controller or the redundancy controller; when the magnetic sensor is determined to be abnormal, determining whether a detection signal received from the coil wound around the magnet in each of the plurality of apparatuses is normal, by the main controller or the redundancy controller; and when the detection signal received from the coil is normal, performing the control of the vehicle by the detection signal received from the coil by the main controller or the redundancy controller.

In the determining whether the magnetic sensor is normal, when a current value within a predetermined range is output from the magnetic sensor, the magnetic sensor may be determined to be normal, and in the determining whether the detection signal received from the coil is normal, when a voltage with a value within a predetermined range is output from the coil, the detection signal may be determined to be normal.

The method may further include determining, by an electronic control unit of the vehicle, whether the main power source is normal, and when the main power source is normal, applying power from the main power source to the main controller; and when the power is applied, determining whether the main controller is normal by self-diagnosis, and when the main controller is determined to be normal, determining, by the electronic control unit, whether the vehicle is accelerating, wherein, when the vehicle is determined to be accelerating, the main controller may supply power to the plurality of apparatuses.

The method may further include, when the main controller is determined to be abnormal, applying power from the main power source to the redundancy controller by the electronic control unit, and when the power is applied, determining whether the redundancy controller is normal by self-diagnosis, and when the redundancy controller is determined to be normal, determining, by the electronic control unit, whether the vehicle is accelerating, wherein, when the vehicle is determined to be accelerating, the redundancy controller may supply power to the plurality of apparatuses.

The method may further include, when the main power source is determined to be abnormal, determining, by the electronic control unit, whether the auxiliary power source is normal; when the auxiliary power source is determined to be normal, applying, by the electronic control unit, power from the auxiliary power source to the redundancy controller; and when the power is applied, determining whether the redundancy controller is normal by self-diagnosis, and when the redundancy controller is determined to be normal, determining, by the electronic control unit, whether the vehicle is accelerating, wherein, when the vehicle is determined to be accelerating, the redundancy controller may supply power to the plurality of apparatuses.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF DRAWINGS

The above and other aspects, features, and advantages of the present invention will be more clearly understood from the following detailed description.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, the present invention will be described in detail with reference to example drawings. In adding reference numerals to components of each of the drawings, it may be noted that the same components are provided the same reference numerals as possible even when they are indicated on different drawings.

Figure 1:
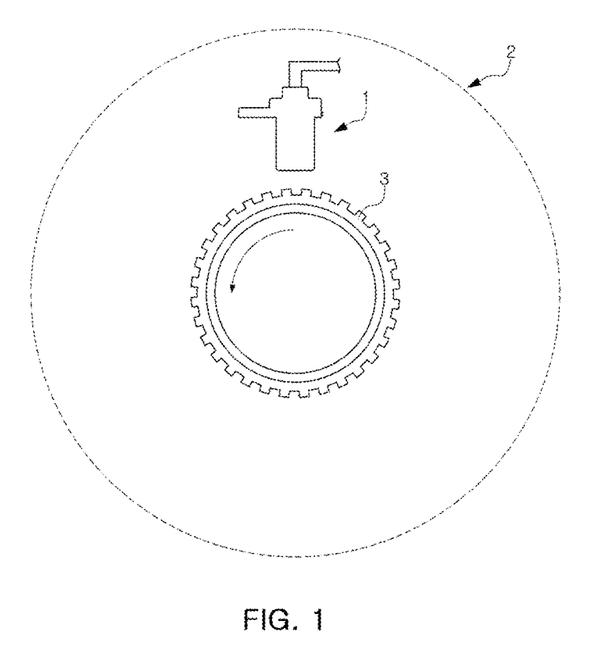
FIG. 1 is an example view exemplarily illustrating a state in which an apparatus of sensing a speed of a wheel, according to various exemplary embodiments of the present invention, is provided on the wheel.

FIG. 1 is an example view exemplarily illustrating a state in which an apparatus of sensing a speed of a wheel, according to various exemplary embodiments of the present invention, is provided on the wheel.

An apparatus 1 for sensing a rotation speed of a wheel 2, according to various exemplary embodiments of the present invention, may be provided to be spaced from an external circumferential surface of a tonewheel 3 mounted on the wheel 2 with a predetermined distance, and detect the rotation speed of the wheel. As described above, the apparatus 1 according to various exemplary embodiments of the present invention may be combined with the tonewheel to detect the rotation speed of the wheel.

The tonewheel 3 may be a disk-shaped member, and may be repeatedly formed with a tooth-shaped portion having peaks and valleys on the external circumferential surface. Due to a difference in protrusion length between the peaks and the valleys, a change in magnetic flux may be induced in the apparatus 1 having a magnet. Therefore, the apparatus may detect the rotation speed of the wheel 2.

The tonewheel may be formed of a material, for example, a strong magnetic material such as a steel material or the like, and a center portion thereof may be coupled to a shaft of the wheel by interference fit or the like.

In a front wheel of a vehicle, for example, the apparatus 1 may be fixed to a steering knuckle, and the tonewheel 3 may be fixed to an axle hub rotor and rotate in synchronization with the front wheel.

Furthermore, in a rear wheel of the vehicle, for example, the apparatus 1 may be fixed to an axle carrier, and the tonewheel 3 may be provided on a driveshaft and rotate in synchronization with the rear wheel.

Therefore, the apparatus 1 may be provided on all wheels of the vehicle, and may detect the rotation speed of the tonewheel 3 rotating together with the wheel 2, to detect the rotation speed of the wheel.

Figure 2:
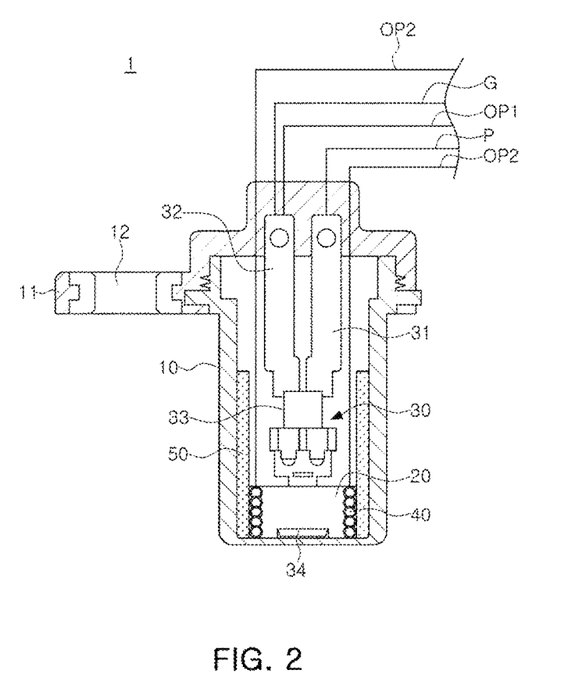
FIG. 2 is a cross-sectional view of an apparatus of sensing a speed of a wheel, according to various exemplary embodiments of the present invention.

FIG. 2 is a cross-sectional view of an apparatus of sensing a speed of a wheel, according to various exemplary embodiments of the present invention. As illustrated, an apparatus 1 for sensing a speed of a wheel, according to the various exemplary embodiments of the present invention, may include a housing 10, a magnet 20, a magnetic sensor 30, and a coil 40.

The housing 10 may be formed in an approximately cylindrical shape, and a flange portion 11 securely fixing the apparatus 1 to, for example, a steering knuckle or an axle carrier may be formed on one side of an external circumferential surface of the housing. A through-hole 12 into which a fixing bolt is fitted may be formed in the flange portion.

Therefore, the fixing bolt may be inserted into the through-hole 12 in the flange portion 11 of the housing 10, and may be fastened to, for example, a steering knuckle or an axle carrier, to install the apparatus 1 adjacent to a tonewheel 3 in a front wheel or a rear wheel of a vehicle.

The magnet 20 may be disposed in the housing 10, to be located adjacent to an external circumferential surface of the tonewheel 3, and is configured to generate magnetic force. In the apparatus 1 according to the various exemplary embodiments of the present invention, the magnet may be formed in an approximately pillar shape.

The magnetic sensor 30 may be a semiconductor sensor that measures a size and direction of a magnetic field or a magnetic force line, and may measure the magnetic field by use of an effect of changing properties of a material due to influence of the magnetic field. For example, a Hall sensor using a Hall effect that generates a voltage when a magnetic field is applied perpendicular to a current flowing through a semiconductor, a magnetoresistive sensor using an electrical resistance effect that increases electrical resistance under influence of a magnetic field, or the like, may be employed The magnetic sensor 30 may be located adjacent to the magnet 20, and may detect a rotation speed of the wheel 2 by a change in magnetic field according to rotation of the tonewheel 3. The magnetic sensor may be an active sensor, and applying of power for outputting a signal may be required.

The magnetic sensor 30 may include a first terminal 31 connected to a power line P, a second terminal 32 connected to a ground line G, a printed circuit board 33 connected to the first terminal and the second terminal, and on which an IC chip is mounted, and a sensing unit 34 electrically connected to the printed circuit board.

In addition to the IC chip, the printed circuit board 33 may be additionally provided with an amplifier, an A/D converter for converting an analog signal into a digital signal, or the like. Furthermore, the printed circuit board may be electrically and physically connected to the sensing unit 34 through a conductor, not illustrated.

The sensing unit 34 may include a semiconductor sensor device such as a Hall device, a magnetoresistive device, or the like. The semiconductor sensor device may be electrically connected to the printed circuit board 33.

In the apparatus 1 according to the various exemplary embodiments of the present invention, the sensing unit 34 of the magnetic sensor 30 may be disposed in the housing 10 and to be located between the tonewheel 3 and the magnet 20. Also, a magnet may be located between the printed circuit board 33 and the sensing unit.

A first output line OP1 may be connected to, for example, the second terminal 32. The magnetic sensor 30 may detect a change in magnetic field, and may output data based on a voltage value or a current value as a digital signal through the first output line.

The coil 40 may be wound around the magnet 20, and the coil wound around the magnet in the present manner may act as a passive sensor. For example, a signal may be output from the coil using Faraday's law of induction, even without supply of power.

When the wheel 2 rotates and a tooth-shaped portion having peaks and valleys, formed on the tonewheel 3, passes through the coil 40 wound around the magnet 20, magnetic flux passing through the coil may change to induce an AC voltage at both end portions of the coil. Since a frequency of the AC voltage is proportional to the rotation speed of the wheel, the rotation speed of the wheel may be detected as the frequency is measured.

A second output line OP2 may be connected to the coil. Data based on a voltage value may be output as an analog signal through the second output line.

The apparatus 1 according to the various exemplary embodiments of the present invention may further include a protective member 50 provided in the housing 10 to surround the magnetic sensor 30 to protect the magnetic sensor from heat.

The protective member 50 may be formed in an approximately tubular shape, and may include, for example, a heat-resistant material or a heat-insulating material such as a plastic, a ceramic, a metal, alloys, or the like. The protective member may be disposed to surround the magnet 20 and the magnetic sensor 30, the IC chip of the printed circuit board 33, to shield the magnetic sensor 30, for example, from high heat generated due to braking of the wheel 2 or an induced current, to prevent the magnetic sensor from being damaged or broken.

As described above, in the apparatus 1 according to the various exemplary embodiments of the present invention, different types of sensors, e.g., heterogeneous wheel speed sensors, may be configured in a single housing 10. A first sensor may be the magnetic sensor 30, and may be an active sensor configured for detecting a change in a magnetic field with the IC chip and outputting the detected change as amplified and digital signals from the printed circuit board 33. A second sensor may be the coil 40 wound around the magnet 20, and may be a passive sensor configured for detecting a change in a magnetic field by the tonewheel 3 and outputting the detected change as an analog signal of an AC voltage.

Even though different types of sensors may be integrated in a single housing 10, the sensors may not affect each other, since the sensors may measure the rotation speed of the wheel 2 using different principles. For example, the magnetic sensor 30 may use a Hall effect, and the coil 40 wound around the magnet 20 may use Faraday's law of induction without supply of power.

As described above, in the apparatus 1 according to the various exemplary embodiments of the present invention, since the different types of wheel speed sensors, configured therein, measure the rotation speed of the wheel 2 using different principles and output signals having different characteristics, accuracy and reliability of information on the rotation speed of the wheel may not be at least lower, compared to that of a conventional sensor.

Furthermore, when the apparatus 1 according to the various exemplary embodiments of the present invention is applied to the wheel 2 of the vehicle to introduce a redundancy concept, the apparatus may be used as a single apparatus of a wheel, and even when the magnetic sensor 30 in the apparatus fails (in a disabled state), a function of the apparatus may be maintained by the coil 40 wound around the magnet 20, to improve operation stability of the sensor.

The apparatus 1 according to the various exemplary embodiments of the present invention may provide not only information such as whether a vehicle is moving, a driving speed, or the like in a driving vehicle, but may also be used in various control systems as a source for specific safety control.

Figure 3:
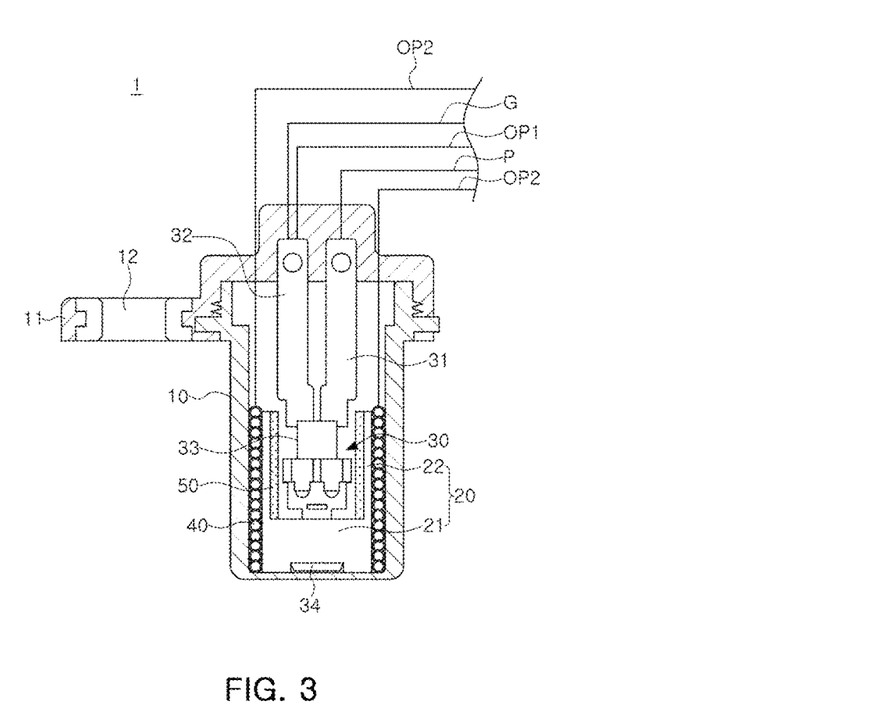
FIG. 3 is a cross-sectional view of an apparatus of sensing a speed of a wheel, according to various exemplary embodiments of the present invention.

FIG. 3 is a cross-sectional view of an apparatus of sensing a speed of a wheel, according to various exemplary embodiments of the present invention. As illustrated, an apparatus 1 for sensing a speed of a wheel, according to the various exemplary embodiments of the present invention, may include a housing 10, a magnet 20, a magnetic sensor 30, and a coil 40.

Furthermore, the apparatus 1 according to the various exemplary embodiments of the present invention may further include a protective member 50 provided in the housing 10 to at least partially surround the magnetic sensor 30 to protect the magnetic sensor from heat.

In the various exemplary embodiments of the present invention illustrated in FIG. 3, only a shape of the magnet 20 and arrangement of the protective member 50 may be different from, and remaining components may be identical to the components of the various exemplary embodiments illustrated in FIG. 2. Therefore, in describing the apparatus according to the various exemplary embodiments of the present invention in FIG. 3, the same components as those of the apparatus according to the above-described various exemplary embodiments in FIG. 2 may be provided the same reference numerals, and detailed description of configurations and functions thereof will be omitted.

In the apparatus 1 according to the various exemplary embodiments of the present invention, the magnet 20 may include a first magnet unit 21 formed in an approximately pillar shape, and a second magnet unit 22 formed in a shape of a cylinder having a hollow portion and in which a cutout portion is formed in at least one side wall thereof, and the first magnet unit and the second magnet unit may be integrally formed.

The magnetic sensor 30 may include a first terminal 31 connected to a power line P, a second terminal 32 connected to a ground line G, a printed circuit board 33 connected to the first terminal and the second terminal, and on which an IC chip or the like is mounted, and a sensing unit 34 electrically connected to the printed circuit board.

In addition to the IC chip, the printed circuit board 33 may be additionally provided with an amplifier, an A/D converter for converting an analog signal into a digital signal, or the like. Furthermore, the printed circuit board may be electrically and physically connected to the sensing unit 34 through a conductor, not illustrated.

In the apparatus 1 according to the various exemplary embodiments of the present invention, the printed circuit board 33 may be disposed in the hollow portion of the second magnet unit 22, and the conductor may connect the printed circuit board in the hollow portion and the sensing unit 34 located adjacent to the first magnet unit 22, through the cutout portion. Therefore, the second magnet unit may help to at least partially surround and protect the printed circuit board.

The sensing unit 34 may include a semiconductor sensor device such as a Hall device, a magnetoresistive device, or the like. The semiconductor sensor device may be electrically connected to the printed circuit board 33.

In the apparatus 1 according to the various exemplary embodiments of the present invention, the sensing unit 34 of the magnetic sensor 30 may be disposed in the housing 10 and to be located between the tonewheel 3 and the first magnet unit 21 of the magnet 20. Also, a first magnet unit may be located between the printed circuit board 33 and the sensing unit.

A first output line OP1 may be connected to, for example, the second terminal 32. The magnetic sensor 30 may detect a change in magnetic field, and may output data based on a voltage value or a current value as a digital signal through the first output line.

The coil 40 may be wound around the magnet 20, may be wound, more specifically, from the first magnet unit 21 to the second magnet unit 22, and the coil wound around the magnet in the present manner may act as a passive sensor. For example, a signal may be output from the coil using Faraday's law of induction, even without supply of power.

The number of turns of the coil 40 may be increased by the second magnet unit 22. In the instant case, since an electromotive force according to Faraday's law of induction is proportional to the number of turns of the coil, even when the wheel 2 rotates at a low speed, a signal having a sufficient magnitude may be output from the coil to obtain information regarding the rotation speed of the wheel.

A second output line OP2 may be connected to the coil 40. Data based on a voltage value may be output as an analog signal through the second output line.

Therefore, in the apparatus 1 according to the various exemplary embodiments of the present invention, the second magnet unit 22 of the magnet 20, together with the first magnet unit 21 and the coil 40, may form a passive sensor that detects a change in magnetic field by the tonewheel 3 to output an analog signal as an AC voltage.

The protective member 50 may be formed in an approximately tubular shape, and may include, for example, a heat-resistant material or a heat-insulating material such as a plastic, a ceramic, a metal, alloys, or the like.

In the apparatus 1 according to the various exemplary embodiments of the present invention, the protective member 50 may be disposed in the hollow portion of the second magnet unit 22 to surround the magnetic sensor 30, at least the IC chip or the like of the printed circuit board 33.

Therefore, the protective member 50, together with the second magnet unit 22, may shield the magnetic sensor 30 from high heat generated by, for example, braking of the wheel 2 or an induced current, to prevent damaging or malfunctioning of the magnetic sensor.

Figure 4:
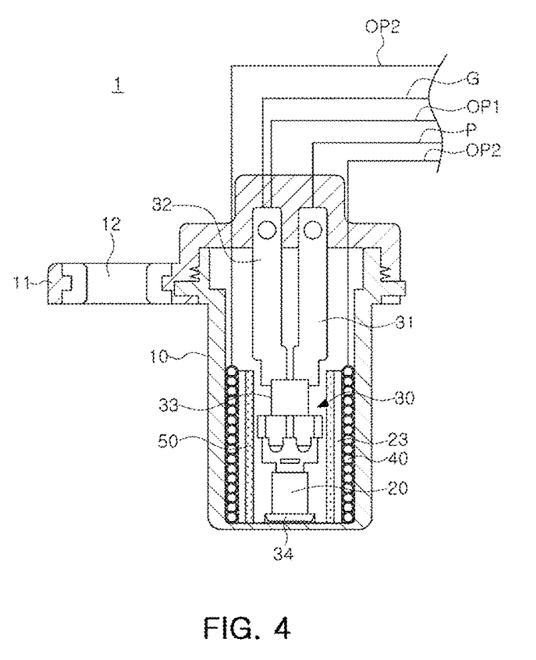
FIG. 4 is a cross-sectional view of an apparatus of sensing a speed of a wheel, according to various exemplary embodiments of the present invention.

FIG. 4 is a cross-sectional view of an apparatus of sensing a speed of a wheel, according to various exemplary embodiments of the present invention. As illustrated, an apparatus 1 for sensing a speed of a wheel, according to the various exemplary embodiments of the present invention, may include a housing 10, a plurality of magnets 20 and 23, a magnetic sensor 30, and a coil 40.

Furthermore, the apparatus 1 according to the various exemplary embodiments of the present invention may further include a protective member 50 provided in the housing 10 to at least partially surround the magnetic sensor 30 to protect the magnetic sensor from heat.

In the various exemplary embodiments of the present invention illustrated in FIG. 4, only addition of an auxiliary magnet 23 and arrangement of the protective member 50 may be different from, and remaining components may be identical to the components of the various exemplary embodiments illustrated in FIG. 2 and the components of the various exemplary embodiments illustrated in FIG. 3. Therefore, in describing the apparatus according to the various exemplary embodiments of the present invention, the same components as those of the apparatus according to the various exemplary embodiments described above may be provided the same reference numerals, and detailed description of configurations and functions thereof will be omitted.

The apparatus 1 according to the various exemplary embodiments of the present invention may include the auxiliary magnet 23 having a shape of a tube and a hollow portion, in addition to the magnet 20. The magnet and the auxiliary magnet may be spaced from each other, and the magnet may be located in the hollow portion of the auxiliary magnet.

The magnetic sensor 30 may include a first terminal 31 connected to a power line P, a second terminal 32 connected to a ground line G, a printed circuit board 33 connected to the first terminal and the second terminal, and on which an IC chip or the like is mounted, and a sensing unit 34 electrically connected to the printed circuit board.

In addition to the IC chip, the printed circuit board 33 may be additionally provided with an amplifier, an A/D converter for converting an analog signal into a digital signal, or the like. Furthermore, the printed circuit board may be electrically and physically connected to the sensing unit 34 through a conductor, not illustrated.

In the apparatus 1 according to the various exemplary embodiments of the present invention, the printed circuit board 33 and the sensing unit 34 may be disposed in the hollow portion of the auxiliary magnet 23. To the present end, the auxiliary magnet may have a length sufficient to cover both the printed circuit board and the sensing unit. Therefore, the auxiliary magnet may help to surround entirely and protect the magnetic sensor 30 and the magnet 20 including the printed circuit board.

The sensing unit 34 may include a semiconductor sensor device such as a Hall element, a magnetoresistive element, or the like. The semiconductor sensor device may be electrically connected to the printed circuit board 33.

In the apparatus 1 according to the various exemplary embodiments of the present invention, the sensing unit 34 of the magnetic sensor 30 may be disposed in the housing 10 and to be located between the tonewheel 3 and the magnet 20. Also, a magnet may be located between the printed circuit board 33 and the sensing unit.

A first output line OP1 may be connected to, for example, the second terminal 32. The magnetic sensor 30 may detect a change in magnetic field, and may output data based on a voltage value or a current value as a digital signal through the first output line.

The coil 40 may be wound around the auxiliary magnet 23, and the coil wound around the auxiliary magnet in the present manner may act as a passive sensor. For example, a signal may be output from the coil using Faraday's law of induction, even without supply of power.

When the coil 40 is wound around the auxiliary magnet 23 having a longer length than the magnet 20, the number of turns of the coil may further increase. In the instant case, since an electromotive force according to Faraday's law of induction is proportional to the number of turns of the coil, even when the wheel 2 rotates at a low speed, a signal having a sufficient magnitude may be output from the coil to obtain information regarding the rotation speed of the wheel.

A second output line OP2 may be connected to the coil 40. Data based on a voltage value may be output as an analog signal through the second output line.

Therefore, in the apparatus 1 according to the various exemplary embodiments of the present invention, the auxiliary magnet 23, together with the coil 40, may form a passive sensor that detects a change in magnetic field by the tonewheel 3 to output an analog signal as an AC voltage.

The protective member 50 may be formed in an approximately tubular shape, and may include, for example, a heat-resistant material or a heat-insulating material such as a plastic, a ceramic, a metal, alloys, or the like.

In the apparatus 1 according to the various exemplary embodiments of the present invention, the protective member 50 may be disposed in the hollow portion of the auxiliary magnet 23 to surround the magnet 20 and the magnetic sensor 30, the printed circuit board 33 and the sensing unit 34.

Therefore, the protective member 50, together with the auxiliary magnet 23, may shield the magnetic sensor 30 from high heat generated by, for example, braking of the wheel 2 or an induced current, to prevent damaging or malfunctioning of the magnetic sensor.

Figure 5A:
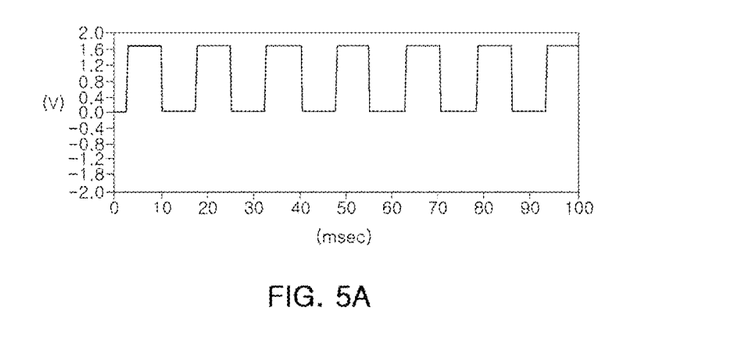
FIG. 5A and FIG. 5B are output waveform diagrams of an apparatus of sensing a speed of a wheel, according to various exemplary embodiments of the present invention.
Figure 5B:
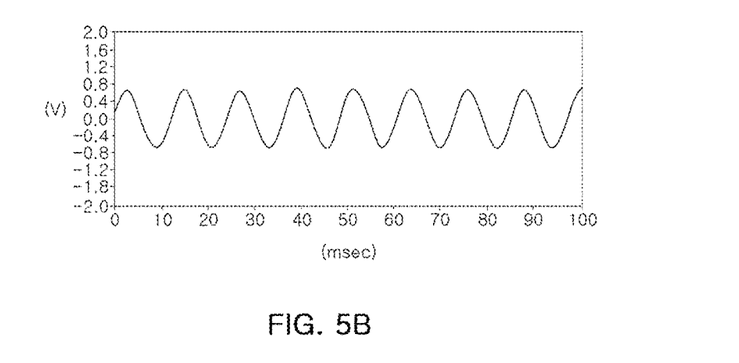

FIG. 5 is an output waveform diagram of an apparatus of sensing a speed of a wheel, according to various exemplary embodiments of the present invention.

FIG. 5A shows a waveform output from a magnetic sensor 30, and it may be seen that the waveform of the signal is a square wave. The signal output from the magnetic sensor may represent a digital signal that has a constant voltage value and discontinuously changes.

FIG. 5B shows a waveform output from a coil 40 wound around a magnet 20 or an auxiliary magnet 23, and it may be seen that the waveform of the signal is a sine wave. The signal output from the coil may represent an analog signal that has several voltage values and continuously changes.

As above, an apparatus 1 for sensing a speed of a wheel, according to various exemplary embodiments of the present invention, may provide two pieces of information by a detection signal in a form of a digital signal of an active sensor, e.g., the magnetic sensor 20, and a detection signal in a form of an analog signal of a passive sensor, e.g., the coil 40 wound around the magnet 20 or the auxiliary magnet 23, to prevent provision of erroneous information, obtaining an effect of improving the reliability of a sensor.

Figure 6:
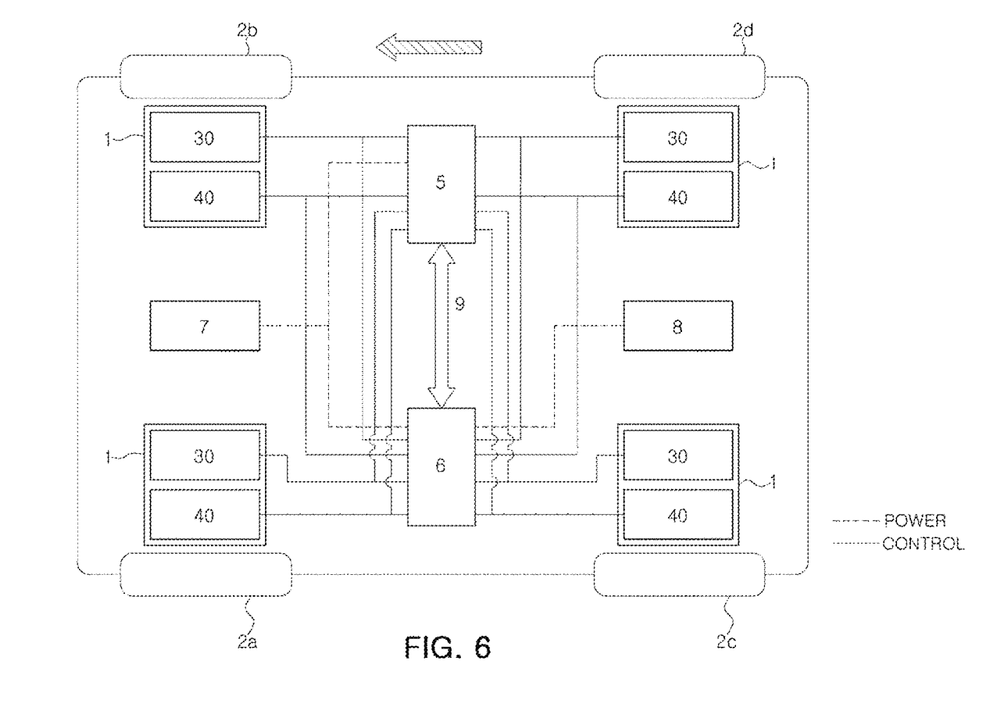
FIG. 6 is a schematic diagram illustrating an example of a control system to which an apparatus of sensing a speed of a wheel, according to various exemplary embodiments of the present invention, is applied.

FIG. 6 is a schematic diagram illustrating an example of a control system to which an apparatus of sensing a speed of a wheel, according to various exemplary embodiments of the present invention, is applied.

A control system according to various exemplary embodiments of the present invention may be a system for controlling a vehicle, and may include a main controller 5, a redundancy controller 6, a plurality of apparatuses 1, a main power source 7, and an auxiliary power source 8.

In the instant case, the control system may be a portion of a control system such as ABS, ASR, VDC, or the like for driving or braking safety of the vehicle. For convenience of description, in the exemplary embodiment, control for braking safety may be referred to as various exemplary embodiments of the present invention, but the example is not necessarily limited thereto.

Furthermore, for convenience of explanation, although an example applied to a vehicle having four wheels 2 such as a front left wheel 2a, a front right wheel 2b, a rear left wheel 2c, and a rear right wheel 2d, are illustrated and described, the number of wheels is not necessarily limited thereto and may increase or decrease.

The main controller 5 and the redundancy controller 6 may include a plurality of electrical and electronic components that provide power and operational control to associated components, respectively. For example, the main controller and the redundancy controller may include a programmable processing unit such as a microprocessor or the like, a memory, and input/output interfaces. The microprocessor or processing unit, the memory, and the input/output interfaces may communicate via or more control or data buses.

The processing unit may execute software stored in the memory. For example, the software may include control commands and related data for braking safety of the vehicle. In the instant case, the main controller 5 and the redundancy controller 6 may be portions of a braking system of the vehicle.

The apparatus 1 may be provided on or near a corresponding wheel 2 of the vehicle. The apparatus may monitor a rotation speed of the wheel, and may provide information indicating the rotation speed of the wheel to the main controller 5 and the redundancy controller 6.

Various subsystems provided in the vehicle, such as a steering system, a power transmission system, an engine or drive motor control system, a tire pressure sensing system, or the like may use information regarding a rotation speed of each of the wheels 2, acquired from the apparatus 1, to monitor or control performance of the vehicle.

The plurality of apparatuses 1 may be respectively connected to the main controller 5 and the redundancy controller 6, and may receive power from the main controller or the redundancy controller.

The main controller 5 may receive information on the rotation speed of the wheel from the plurality of apparatuses 1, and the redundancy controller 6 may also receive information regarding the rotation speed of the wheel from the plurality of apparatuses. For example, the main controller may share information regarding the rotation speed of the wheel received from the plurality of apparatuses, with the redundancy controller.

The main controller 5 or the redundancy controller 6 may perform, for example, braking safety control by a detection signal received from an active sensor, e.g., a magnetic sensor 30, in the apparatus 1. Of course, the main controller or the redundancy controller may receive a detection signal from a passive sensor, e.g., a coil 40 wound around a magnet in the apparatus, as well as the active sensor.

For example, the main controller 5 may also directly receive the detection signal of the passive sensor, and determine whether a detection signal of the active sensor is abnormal, or use the detection signal of the passive sensor as an alternative signal when the active sensor is abnormal. Similarly, the redundancy controller 6 may also directly receive the detection signal of the passive sensor, and determine whether a detection signal of the active sensor is abnormal, or use the detection signal of the passive sensor instead of the detection signal of the active sensor.

In the present manner, the main controller 5 or the redundancy controller 6 may use information by the two detection signals, to prevent erroneous control and thus improve reliability for the controller.

When an abnormality or failure occurs in the active sensor, e.g., the magnetic sensor 30, the main controller 5 or the redundancy controller 6 may perform, for example, control for braking safety by the detected signal received from the passive sensor in the apparatus 1, connected thereto, e.g., the coil 40 wound around the magnet.

When the apparatus 1 is normal and an abnormality or failure occurs in the main controller 5, the redundancy controller 6 may perform all roles of the main controller instead.

The redundancy controller 6 may supply power to the magnetic sensor 30 of the apparatus 1, and may receive information regarding the rotation speed of the wheel 2 from the apparatus, to perform control for braking safety, for example.

The main power source 7 and the auxiliary power source 8 may include a battery, respectively. The present invention is not necessarily limited thereto, and any other type of power source device may be employed as long as it may supply power.

The main power source 7 may be connected to provide power to the main controller 5 and the redundancy controller 6 respectively. The auxiliary power source 8 may be connected only to provide power to the redundancy controller 6.

The main power source 7 and the auxiliary power source 8 may operate independently of each other. For example, when the main power source is inoperable, the auxiliary power source may supply power to the redundancy controller 6 to perform control.

For example, in a redundancy state in which the main power source 7 has a problem, the auxiliary power source 8 and the redundancy controller 6 may perform control for braking safety.

As described above, the redundancy controller 6 may supply power from the auxiliary power source 8 to the magnetic sensor 30 of the apparatus 1, and may receive information regarding the rotation speed of the wheel 2 from the apparatus, to perform control for braking safety, for example.

In the instant case, when an abnormality or failure occurs in the active sensor of the apparatus 1, e.g., the magnetic sensor 30, the redundancy controller 6 may perform, for example, control for braking safety by the detected signal received from the passive sensor in the apparatus, e.g., the coil 40 wound around the magnet.

The control system according to various exemplary embodiments of the present invention may further include a communication link 9. As the communication link, for example, wireless communication or the like such as a communication network using a controller area network (CAN) protocol may be employed, but is not limited thereto, and wired or optical communication may be also applied.

The main controller 5 and the redundancy controller 6 may synchronize and exchange information via the communication link 9. For example, the main controller and the redundancy controller may be synchronized when the vehicle is powered on, and may maintain synchronous communication while in an on state.

Furthermore, the main controller 5 or the redundancy controller 6 may transmit information regarding the rotation speed of the wheel 2 to an electronic control unit of the vehicle through the communication link 9.

When an abnormality or failure occurs in the magnetic sensor 30, the main controller 5 or the redundancy controller 6 may transmit information regarding failure of a sensor through the communication link 9 and the rotation speed of the wheel 2 obtained from a replacement sensor, to the electronic control unit of the vehicle. Accordingly, other subsystems may also share a current state of the apparatus 1.

Furthermore, the main controller 5 and the redundancy controller 6 may perform self-diagnosis regarding whether their operating state is normal or not by a diagnostic element or diagnostic software therein, or the like, respectively. The main controller or the redundancy controller may transmit information regarding its own failure to the electronic control unit of the vehicle via the communication link 9.

Figure 7:
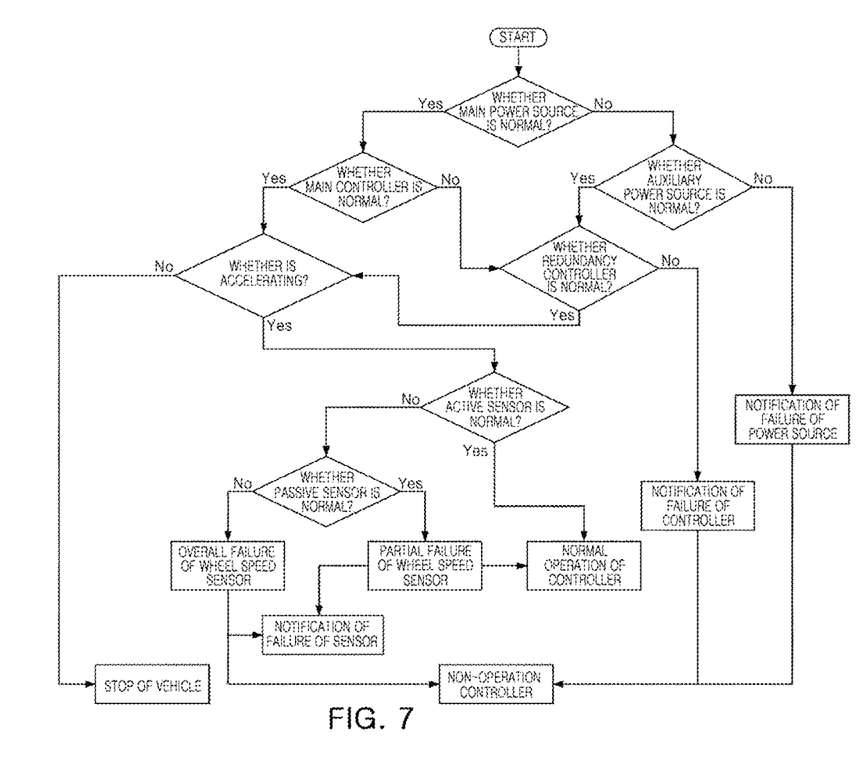
FIG. 7 is a flowchart illustrating an operation of the control system illustrated in FIG. 6.

FIG. 7 is a flowchart illustrating an operation of the control system illustrated in FIG. 6.

An operating method of a control system to which an apparatus 1 for sensing a speed of a wheel, according to various exemplary embodiments of the present invention, is applied, may include, when power of a vehicle is turned on, determining whether a main power source 7 is normal by an electronic control unit of the vehicle, and when the main power source is normal, applying the power from the main power source to a main controller 5; when the power is applied to the main controller 5, determining whether the main controller 5 is normal by self-diagnosis of the main controller, and when the main controller is determined to be normal, determining whether the vehicle is accelerating by the electronic control unit.

The electronic control unit of the vehicle may determine that the main power source 7 is normal, when the main power source 7 outputs a voltage value in a predetermined range, for example, a voltage of about 16 to 32V.

Also, the electronic control unit may determine whether the vehicle is accelerating by checking an opening amount (>0%) of an accelerator pedal from, for example, an accelerator pedal sensor (APS, not illustrated) of the vehicle. When the vehicle is not accelerating, a stop of the vehicle may be maintained.

When the vehicle is determined to be accelerating, the main controller 5 may supply power to the apparatus 1, for example, to control the control system for braking safety.

An operating method of a control system may include supplying power to an apparatus 1 for sensing a speed of a wheel 2, by a main controller 5, and determining whether an active sensor, e.g., a magnetic sensor 30 in the apparatus is normal; when the magnetic sensor is determined to be normal, receiving information regarding a rotation speed of the wheel 2 from the magnetic sensor by the main controller; when the magnetic sensor in at least one apparatus among a plurality of apparatuses for sensing a speed of a wheel, is determined to be abnormal, determining whether a signal received from a passive sensor, e.g., a coil 40 wound around a magnet in the apparatus is normal, by the main controller; and when the signal received from the coil is normal, performing control of a vehicle by the signal received from the coil by the main controller.

In the instant case, the main controller 5 may determine that the magnetic sensor 30 is normal when a current value in a predetermined range from the magnetic sensor 30, for example, a current of about 6 to 17 mA is output. Also, the main controller may be configured to determine that the signal received from the coil is normal when a voltage value from the coil 40 in a predetermined range, for example, a voltage of about 1 to 10 V, is output.

Accordingly, when the magnetic sensor 30 is normal or abnormal, the main controller 5 may receive information regarding the rotation speed of the wheel 2 from the plurality of apparatuses 1, and may operate normally. For example, the main controller may process control commands and related data required for control for braking safety.

When the magnetic sensor 30 is determined to be abnormal, the main controller 5 may notify the electronic control unit of the vehicle that a portion of the apparatus 1 is defective. The electronic control unit may share a current state of the apparatus with other subsystems, and may indicate that a portion of the apparatuses is defective on a display such as an instrument panel or the like.

Nevertheless, the main controller 5 may perform, for example, control of the control system for braking safety of the vehicle through the signal received from the coil 40 of the apparatus 1.

When the signal received from the coil 40 in at least one of the plurality of apparatuses 1 is determined to be abnormal, the main controller 5 may notify the electronic control unit of the vehicle that all of the apparatuses are defective. The electronic control unit may share a current state of the apparatus with other subsystems, and may indicate that all the apparatuses are defective on a display such as an instrument panel or the like.

When the signal of the apparatus 1 is abnormal, there may be a short circuit or disconnection, deterioration of a device or a chip, or the like, for example.

The operation of the main controller 5 may be then stopped. Therefore, for example, since control for braking safety may not be implemented, an operation of the control system may be stopped.

An operating method of a control system may include, when the main controller 5 is determined to be abnormal, entering a redundancy state for the main controller, and applying power from the main power source 7 to the redundancy controller 6 by the electronic control unit of the vehicle.

Alternatively, an operating method of a control system may include, when the main power source 7 is determined to be abnormal, entering a redundancy state for the main power source, and determining whether the auxiliary power source 8 is normal by the electronic control unit of the vehicle, and when the auxiliary power source is determined to be normal, applying power to the redundancy controller 6 from the auxiliary power source 8 by the electronic control unit of the vehicle.

The auxiliary power source 8 may be determined to be normal when the auxiliary power source 8 outputs a voltage value within a predetermined range, for example, a voltage of about 16 to 32V.

When the auxiliary power source 8 is abnormal, the electronic control unit of the vehicle may indicate that the power source is defective on a display such as an instrument panel or the like. Furthermore, since the main controller 5 may not be operated, the control for braking safety may not be implemented to stop an operation of the control system, for example.

When an abnormality or failure occurs in the main power source 7 or the main controller 5, the redundancy controller 6 may perform all the roles of the main controller instead.

Furthermore, the operating method of the control system may include, when power is applied from the main power source 7 or the auxiliary power source 8 to the redundancy controller 6, the redundancy controller may be configured to determine whether the redundancy controller is normal by self-diagnosis, and when the redundancy controller is normal, determining whether the vehicle is accelerating by the electronic control unit.

When the vehicle is determined to be accelerating, the redundancy controller 6 may supply power to the apparatus 1 to perform, for example, control of the control system for braking safety.

Therefore, the redundancy controller 6 may perform control of the vehicle by performing the operating method of the above-described control system as it is, instead of the main controller 5.

When the redundancy controller 6 is abnormal, the electronic control unit of the vehicle may indicate that the controller is defective on a display such as an instrument panel or the like. Also, since the main controller 5 and the redundancy controller 6 may not be operated, control for braking safety may not be implemented to stop an operation of the control system, for example.

As described above, the control system and the operating method according to various exemplary embodiments of the present invention may use a detection signal of the passive sensor, instead of the active sensor, in case of an abnormality of the active sensor in one apparatus. Therefore, even without an additional wheel speed sensor, information regarding a rotation behavior of the wheel may be stably provided.

Furthermore, the control system and the operating method according to various exemplary embodiments of the present invention have advantages of stably performing control for driving or braking safety of the vehicle, because information on the rotational behavior of the wheel may be stably provided even under a redundancy state.

According to various exemplary embodiments of the present invention, in providing information regarding rotational behavior of a wheel, it is possible to obtain an effect of stably providing the information by one apparatus having the same functions as that of two combined wheel speed sensors.

Furthermore, according to various exemplary embodiments of the present invention, even when a magnetic sensor fails, since another type of detection signal may be provided by a coil wound around a magnet, entire operational stability of an apparatus of sensing a speed of a wheel may be improved.

Furthermore, according to various exemplary embodiments of the present invention, provision of erroneous information by use of two detection signals may be prevented to improve reliability for sensing.

Furthermore, the term related to a control device such as "controller", "control unit", "control device" or "control module", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present invention. The control device according to exemplary embodiments of the present invention may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may generate a control signal according to the processing result.

The control device may be at least one microprocessor operated by a predetermined program which may include a series of commands for carrying out the method included in the aforementioned various exemplary embodiments of the present invention.

The aforementioned invention can also be embodied as computer readable codes on a computer readable recording medium. The computer readable recording medium is any data storage device that can store data which may be thereafter read by a computer system. Examples of the computer readable recording medium include hard disk drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet).

In various exemplary embodiments of the present invention, each operation described above may be performed by a control device, and the control device may be configured by a plurality of control devices, or an integrated single control device.

In various exemplary embodiments of the present invention, the control device may be implemented in a form of hardware or software, or may be implemented in a combination of hardware and software.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. An apparatus of sensing a rotation speed of a wheel of a vehicle, provided to be spaced from an external circumferential surface of a tonewheel mounted on the wheel, the apparatus comprising:
a housing;
a magnet disposed in the housing;
a magnetic sensor located in the housing;
a coil wound around the magnet; and
a protective member provided in the housing to surround the magnetic sensor,
wherein the protective member includes a heat-resistant material or a heat-insulating material,
wherein a first output line is connected to the magnetic sensor to output a signal from the magnetic sensor,
wherein a second output line is connected to the coil to output a signal from the coil,
wherein the magnetic sensor is located adjacently to the magnet, and detects the rotation speed of the wheel by a change in magnetic field according to rotation of the tonewheel, and
wherein an AC voltage is induced in the coil wound around the magnet according to a change in the magnetic field caused by the tonewheel, and the rotation speed of the wheel is sensed by measuring a frequency of the AC voltage.

2. The apparatus of claim 1, wherein the magnetic sensor includes:
a first terminal connected to a power line;
a second terminal connected to a ground line;
a printed circuit board connected to the first terminal and the second terminal, and on which an IC chip is mounted; and
a sensing unit having a semiconductor sensor device electrically connected to the printed circuit board,
wherein the first output line is connected to the second terminal.

3. The apparatus of claim 2, wherein the sensing unit is located in the housing between the tonewheel and the magnet, and the magnet is located between the printed circuit board and the sensing unit.

4. The apparatus of claim 1,
wherein the magnet has a shape of a pillar.

5. The apparatus of claim 1,
wherein the magnetic sensor forms an active sensor configured for detecting a change in a magnetic field and outputting the detected change thereof as a digital signal, and
wherein the coil wound around the magnet forms a passive sensor configured for detecting a change in a magnetic field and outputting the detected change thereof as an analog signal of the AC voltage.

6. The apparatus of claim 1, wherein the magnet includes:
a first magnet unit formed to have a shape of a pillar, and
a second magnet unit formed to have a shape of a cylinder with a hollow portion and in which a cutout portion is formed in at least one side wall thereof,
wherein the first magnet unit and the second magnet unit are integrally formed, and
wherein the coil is wound from the first magnet unit to the second magnet unit.

7. The apparatus of claim 6,
wherein the protective member is disposed in the hollow portion of the second magnet unit.

8. The apparatus of claim 1, further including:
an auxiliary magnet having a shape of a tube and a hollow portion,
wherein the magnet and the auxiliary magnet are spaced from each other, and the magnet is located in the hollow portion of the auxiliary magnet, and
wherein the coil is wound around the auxiliary magnet.

9. The apparatus of claim 8,
wherein the protective member is disposed in the hollow portion of the auxiliary magnet.

10. The apparatus of claim 8,
wherein the magnetic sensor forms an active sensor configured for detecting a change in a magnetic field and outputting the detected change thereof as a digital signal, and
wherein the coil wound around the magnet and the auxiliary magnet form a passive sensor configured for detecting a change in a magnetic field and outputting the detected change thereof as an analog signal of the AC voltage.

11. A control system comprising:
a plurality of apparatuses of claim 1, provided on or adjacently to each wheel of the vehicle to detect a rotation speed of each wheel;
a main controller connected to the plurality of apparatuses and connected to a main power source; and
a redundancy controller connected to the plurality of apparatuses and connected to the main power source and an auxiliary power source,
wherein the main controller or the redundancy controller is provided with a detection signal received from the magnetic sensor in each apparatus and a detection signal received from the coil wound around the magnet in each apparatus.

12. The control system of claim 11, further including a communication link exchanging information between the main controller and the redundancy controller.

13. A method for controlling a vehicle, the method comprising:
connecting a plurality of apparatuses of claim 1, to a main controller and a redundancy controller;
supplying power to each of the plurality of apparatuses by the main controller or the redundancy controller, and determining whether the magnetic sensor in each of the plurality of apparatuses is normal;
when the magnetic sensor is determined to be normal, receiving information regarding the rotation speed of the wheel from the magnetic sensor by the main controller or the redundancy controller;
when the magnetic sensor is determined to be abnormal, determining whether a detection signal received from the coil wound around the magnet in each of the plurality of apparatuses is normal, by the main controller or the redundancy controller; and when the detection signal received from the coil is normal, performing the control of the vehicle by the detection signal received from the coil by the main controller or the redundancy controller, wherein each apparatus is electrically connected together to the main controller and the redundancy controller, wherein, in the determining whether the magnetic sensor is normal, when a current value within a predetermined range is output from the magnetic sensor, the magnetic sensor is determined to be normal, and in the determining whether the detection signal received from the coil is normal, when a voltage value within a predetermined range is output from the coil, the detection signal is determined to be normal.

14. The method of claim 13, further including:

determining, by an electronic control unit of the vehicle, whether a main power source is normal, and when the main power source is normal, applying power from the main power source to the main controller; and when the power is applied, determining whether the main controller is normal by self-diagnosis, and when the main controller is determined to be normal, determining, by the electronic control unit, whether the vehicle is accelerating, wherein, when the vehicle is determined to be accelerating, the main controller is configured to supply power to the plurality of apparatuses.

15. The method of claim 14, further including:

when the main controller is determined to be abnormal, applying, by the electronic control unit, power from the main power source to the redundancy controller; and when the power is applied, determining whether the redundancy controller is normal by self-diagnosis, and when the redundancy controller is determined to be normal, determining, by the electronic control unit, whether the vehicle is accelerating, wherein, when the vehicle is determined to be accelerating, the redundancy controller is configured to supply power to the plurality of apparatuses.

16. The method of claim 14, further including:

when the main power source is determined to be abnormal, determining, by the electronic control unit, whether an auxiliary power source is normal;

when the auxiliary power source is determined to be normal, applying, by the electronic control unit, power from the auxiliary power source to the redundancy controller; and when the power is applied, determining whether the redundancy controller is normal by self-diagnosis, and when the redundancy controller is determined to be normal, determining, by the electronic control unit, whether the vehicle is accelerating, wherein, when the vehicle is determined to be accelerating, the redundancy controller is configured to supply power to the plurality of apparatuses.

* * * * *